(12) United States Patent
Liou et al.

(10) Patent No.: US 7,778,024 B2
(45) Date of Patent: Aug. 17, 2010

(54) BOARD CARD AND ELECTRICAL FAN THEREOF

(75) Inventors: Fou-Ming Liou, Taipei (TW); Chih-Peng Wu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 0 days.

(21) Appl. No.: 12/262,168

(22) Filed: Oct. 30, 2008

(65) Prior Publication Data
US 2009/0116191 A1 May 7, 2009

(30) Foreign Application Priority Data
Nov. 1, 2007 (TW) .............................. 96218403 U

(51) Int. Cl.
*H05K 7/20* (2006.01)
(52) U.S. Cl. .................. 361/679.46; 361/695; 361/719; 361/720; 415/76; 415/118; 416/5; 417/423.1
(58) Field of Classification Search ............ 361/679.46, 361/679.48, 690–697, 715, 717–719; 174/16.3, 174/252; 165/80.3, 104.33, 185; 415/118, 415/76; 416/5, 212 R, 212 A, 223 R, 244 R; 417/423.1; 362/96, 540, 543, 545, 547; 340/815.4, 340/815.45, 815.53
See application file for complete search history.

(56) References Cited

U.S. PATENT DOCUMENTS

| | | | | |
|---|---|---|---|---|
| 4,949,022 A * | 8/1990 | Lipman | .................. | 318/400.08 |
| 6,679,771 B2 * | 1/2004 | Lee | .............................. | 454/184 |
| 6,790,003 B1 * | 9/2004 | Hu et al. | .......................... | 416/5 |
| 6,999,894 B2 * | 2/2006 | Lin et al. | ..................... | 702/179 |
| 7,029,247 B2 * | 4/2006 | Huang | ...................... | 417/423.1 |
| 7,037,073 B2 * | 5/2006 | Lin | ................. | 416/5 |
| 7,055,977 B2 * | 6/2006 | Lai | .............................. | 362/96 |
| 7,121,697 B2 * | 10/2006 | Hsu | .......................... | 362/386 |
| 7,183,939 B1 * | 2/2007 | Lo et al. | ................. | 340/815.53 |
| 7,332,841 B2 * | 2/2008 | Hsu | ............... | 310/73 |
| 7,425,116 B2 * | 9/2008 | Chang | ........................... | 416/5 |
| 7,443,680 B1 * | 10/2008 | Peng et al. | .................. | 361/704 |
| 7,563,070 B2 * | 7/2009 | Lin et al. | ..................... | 415/118 |
| 2003/0231956 A1 * | 12/2003 | Lin | ............................ | 415/118 |
| 2004/0257774 A1 * | 12/2004 | Lin | ............................ | 361/719 |
| 2006/0039120 A1 * | 2/2006 | Young | ........................ | 361/719 |
| 2006/0133920 A1 * | 6/2006 | Chen | ........................... | 415/76 |
| 2006/0152683 A1 * | 7/2006 | Lee | ............................ | 353/57 |
| 2007/0025080 A1 * | 2/2007 | Li et al. | ...................... | 361/695 |

FOREIGN PATENT DOCUMENTS

TW 240857 B1 * 6/2001

* cited by examiner

*Primary Examiner*—Michael V Datskovskiy
(74) *Attorney, Agent, or Firm*—Jianq Chyun IP Office

(57) ABSTRACT

A board card having a control circuit includes a first substrate and an electrical fan. The first substrate has a heat source and the electrical fan is disposed on the first substrate. The electrical fan includes a revolving spindle, a plurality of blades and a LED module. The revolving spindle is disposed on the first substrate and rotates about an axis. The blades are joined with the revolving spindle. The LED module is electrically connected to the control circuit, wherein when the revolving spindle drives the blades rotate, the light-emitting direction of the LED module is along a radial direction of the revolving spindle.

12 Claims, 5 Drawing Sheets

BOARD CARD AND ELECTRICAL FAN THEREOF

CROSS-REFERENCE TO RELATED APPLICATION

This application claims the priority benefit of Taiwan application serial no. 96218403, filed on Nov. 1, 2007. The entirety of the above-mentioned patent application is hereby incorporated by reference herein and made a part of this specification.

BACKGROUND OF THE UTILITY MODEL

1. Field of the Utility Model

The present invention generally relates to a board card, and more particularly, to a board card and the electrical fan thereof, by which a user can easily read messages.

2. Description of Related Art

Along with the progress of the computer technology, a user has higher and higher requirements on the display frames of a computer during working or playing games. To meet the critical demand on the display function, a board card such as a graphics card today is equipped with more and more chips, which results in significant heat. To solve the heat dissipation problem, a board cardgraphics card is usually equipped with an electrical fan to facilitate the heat dissipation thereof.

FIG. 1A is a diagram of a conventional electrical fan and FIG. 1B is a diagram showing a board cardgraphics card having an electrical fan disposed on a circuit board. Referring to FIGS. 1A and 1B, a conventional electrical fan 100 is disposed on a board cardgraphics card 150, wherein the electrical fan 100 includes a revolving spindle 110 and a plurality of blades 120 joined with the revolving spindle 110. When the electrical fan 100 is driven, the revolving spindle 110 drives the blades 120 rotate so as to remove the heat generated by the board cardgraphics card. In addition, a light emitting diode module (LED module) 130 is disposed on a surface of the electrical fan 100 parallel to the rotation plane of the blades 120. The LED module 130 is used to display a brand mark so that a user has an impression of the brand mark, or used to display other messages.

However, when the above-mentioned board cardgraphics card 150 is inserted in a slot of a circuit board 200, the light-emitting direction of the LED module 130 of the electrical fan 100 is parallel to the circuit board 200. Therefore, the user is unable to read the message displayed by the LED module 130.

SUMMARY OF THE UTILITY MODEL

Accordingly, the present invention is directed to a board card and an electrical fan thereof with a function of displaying messages easily read by a user.

The present invention provides an electrical fan of a board card being adapted to be electrically connected to a control circuit. The electrical fan includes a revolving spindle, a plurality of blades and an LED module. The revolving spindle rotates about an axis. The blades are joined with the revolving spindle. The LED module is electrically connected to the control circuit. When the revolving spindle drives the blades rotate, the light-emitting direction of the LED module is a radial direction of the revolving spindle.

According to an embodiment of the present invention, the above-mentioned LED module has a plurality of light emitting diodes (LEDs) disposed at the edges of the blades.

According to an embodiment of the present invention, the above-mentioned LED module includes a second substrate and a plurality of LEDs, wherein the second substrate is connected to the revolving spindle, the LEDs are disposed on a surface of the second substrate and the normal vector of the surface is a radial direction of the revolving spindle.

According to an embodiment of the present invention, the above-mentioned control circuit controls the LEDs to progressively display messages.

According to an embodiment of the present invention, the above-mentioned LED module is located in the rotation path of the outermost edges of the blades.

According to an embodiment of the present invention, the above-mentioned LED module is located outside the rotation path of the outermost edges of the blades.

The present invention also provides a board card, which has a control circuit. The board card includes a first substrate and an electrical fan. The first substrate has a heat source and the electrical fan is disposed on the first substrate. The electrical fan includes a revolving spindle, a plurality of blades and an LED module. The revolving spindle is disposed on the first substrate and rotates about an axis. The blades are joined with the revolving spindle. The LED module is electrically connected to the control circuit. When the revolving spindle drives the blades rotates, the light-emitting direction of the LED module is a radial direction of the revolving spindle.

According to an embodiment of the present invention, the above-mentioned LED module has a plurality of LEDs disposed at the edges of the blades.

According to an embodiment of the present invention, the above-mentioned LED module includes a second substrate and a plurality of LEDs, wherein the second substrate is connected to the revolving spindle, the LEDs are disposed on a surface of the second substrate and the normal vector of the surface is a radial direction of the revolving spindle.

According to an embodiment of the present invention, the above-mentioned LED module is located in the rotation path of the outermost edges of the blades.

According to an embodiment of the present invention, the above-mentioned LED module is located outside the rotation path of the outermost edges of the blades.

According to an embodiment of the present invention, the above-mentioned LED module is located inside the rotation path of the outermost edges of the blades.

According to an embodiment of the present invention, the above-mentioned control circuit includes a micro controller.

According to an embodiment of the present invention, the above-mentioned control circuit controls the LEDs to progressively display messages.

According to an embodiment of the present invention, the above-mentioned first substrate includes a sound card or a graphics card.

In the electrical fan of the present invention, the light-emitting direction of the LEDs is parallel to the revolving spindle; therefore, during the rotation of the blades, a user can conveniently read the messages displayed by the LEDs.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
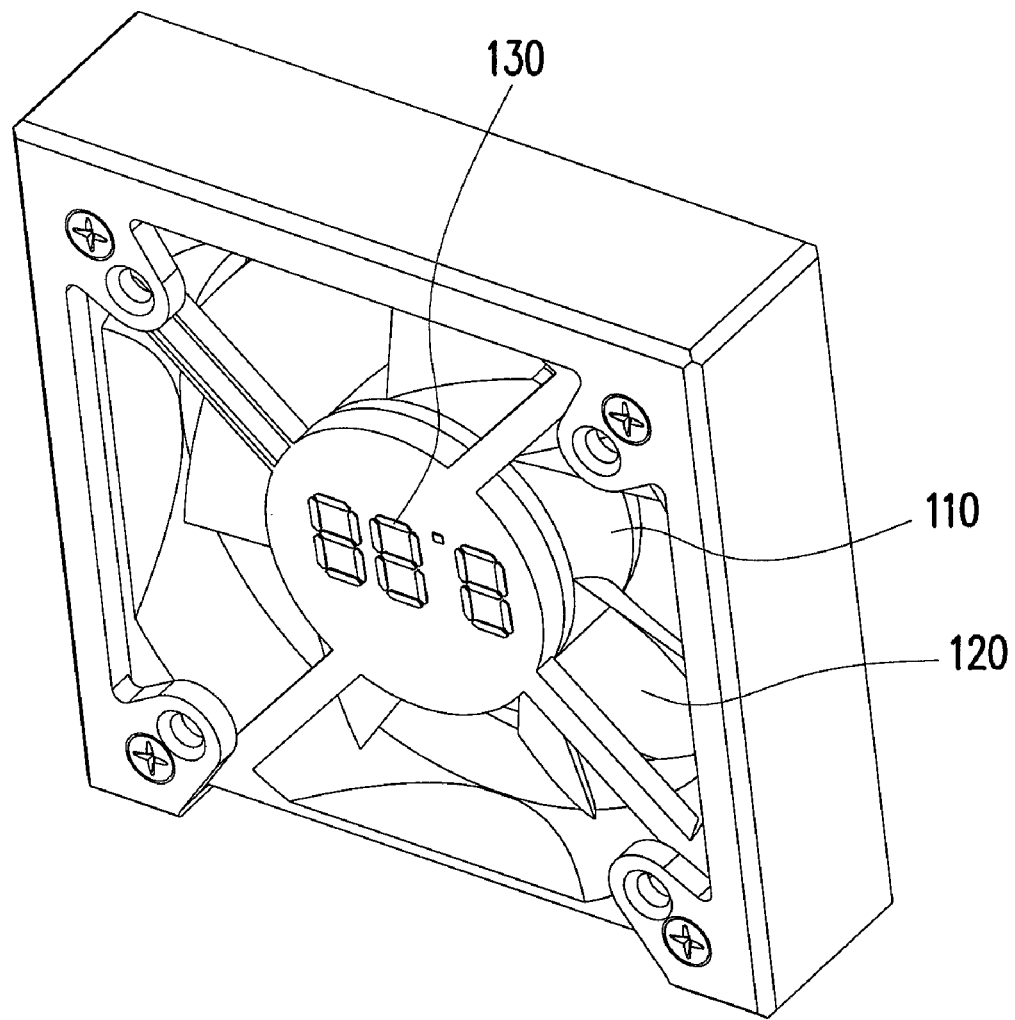
FIG. 1A is a diagram of a conventional electrical fan.
Figure 1B:
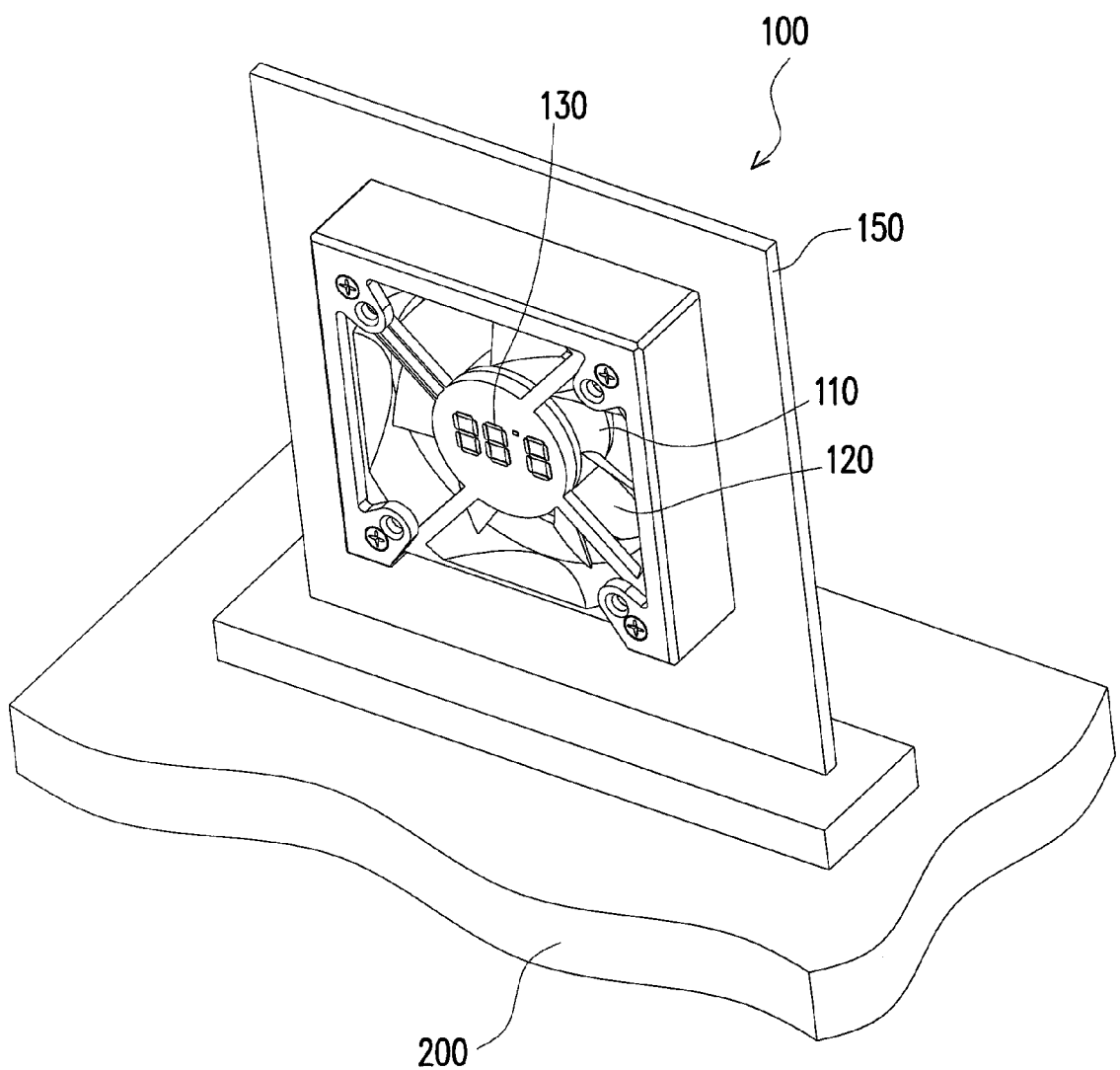
FIG. 1B is a diagram showing a graphics card having an electrical fan disposed on a circuit board.

Reference will now be made in detail to the present preferred embodiments of the invention, examples of which are illustrated in the accompanying drawings. Wherever possible, the same reference numbers are used in the drawings and the description to refer to the same or like parts.

Figure 2:
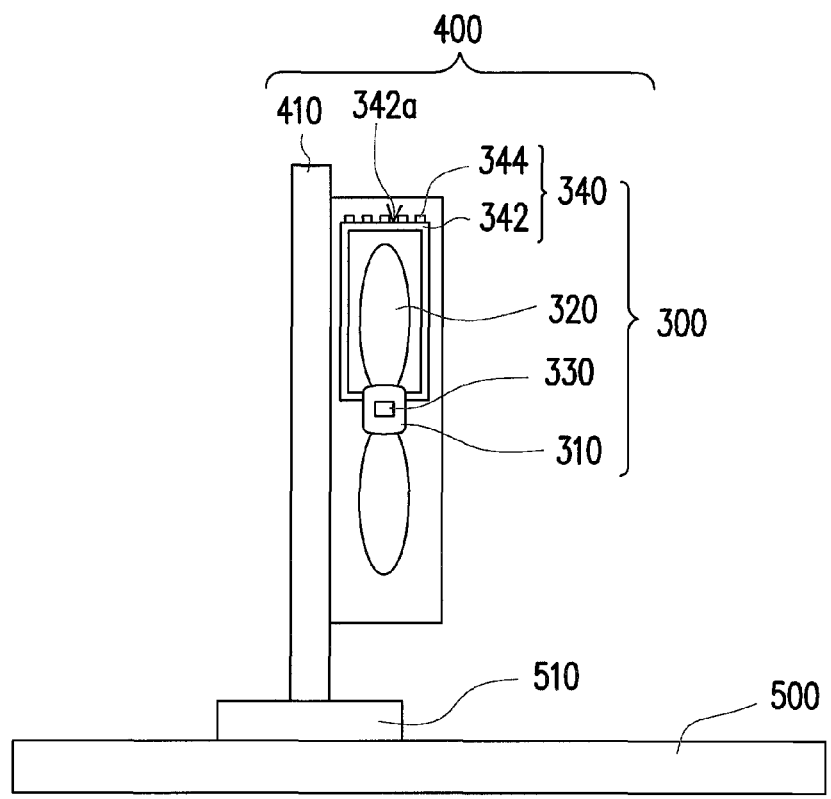
FIG. 2 is a diagram showing a board card disposed on a circuit board.
Figure 3:
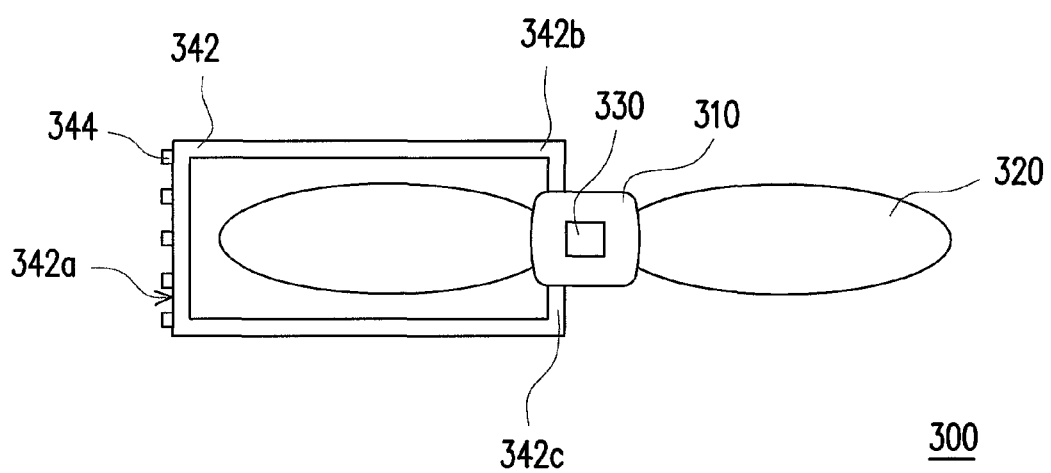
FIG. 3 is a diagram of the electrical fan in FIG. 2.

FIG. 2 is a diagram showing a board card disposed on a circuit board and FIG. 3 is a diagram of the electrical fan of the board card in FIG. 2. Referring to FIGS. 2 and 3, an electrical fan 300 is disposed on a first substrate 410 to form a board card 400, wherein the board card 400 has a control circuit 330. The first substrate 410 of the embodiment has a heat source (not shown) and can be a graphics card in charge of processing images voluminously, a sound card in charge of processing audio signals or other board cards with a heat source to be dissipated. The electrical fan 300 disposed on the first substrate 410 is used for dissipating the heat from the first substrate 410 so as to keep the first substrate 410 normally running.

The board card 400 is inserted into a slot 510 on the motherboard 500 of a computer and electrically connected to the motherboard 500. The electrical fan 300 includes a revolving spindle 310, a plurality of blades 320 and an LED module 340. The blades 320 are joined with the revolving spindle 310 and the control circuit 330 is electrically connected to the LED module 340. When the revolving spindle 310 drives the blades 320 rotate, the light-emitting direction of the LED module 340 is a radial direction of the revolving spindle 310 so that a user easily reads the messages displayed by the LED module 340.

In an embodiment, the control circuit 330 can be a control circuit board or a micro controller disposed at the revolving spindle 310. However, people skilled in the art should understand, the control circuit 330 can be disposed at any place of the board card 400 or of the motherboard 500 as well, wherein the LED module 340 is required to emit light driven by the control circuit 330. Besides, the LED module 340 of the embodiment includes a second substrate 342 and a plurality of LEDs 344. The second substrate 342 is connected to the revolving spindle 310, the LEDs 344 are disposed on an outward surface 342a of the second substrate 342 and the normal vector of the surface 342a is a radial direction of the revolving spindle 310.

In more detail, the second substrate 342 can be ⊓-shaped, and two ends 342b and 342c of the second substrate 342 are connected to the revolving spindle 310. In the embodiment, the LED module 340 is located outside the rotation path of the outermost edges of the blades 320. In other words, the second substrate 342 is connected to the revolving spindle 310 across the blades 320, as shown in FIG. 3. Although the second substrate 342 of the embodiment is exemplarily ⊓-shaped, but people skilled in the art should understand, the second substrate 342 can have other shapes. For example, one end of the second substrate 342 can be connected to the revolving spindle 310 and the other end, which is a free end with L-shape.

The control circuit 330 controls all the LEDs 344 to light or dim simultaneously. The control circuit 330 can also control a part of the LEDs 344 to progressively display messages. The control circuit 330 further can control the LED module 340 to display messages provided to a user. For example, the control circuit 330 is able to make the LED module 340 display some messages in relation to the computer, such as the temperature of heat source of the first substrate 410, overclocking frequency of the computer, the rotation speed of the electrical fan, and the like. On the other hand, by means of a control of a software, the LED module 340 displays some messages received by the control circuit 330 from outside the computer, such as atmospheric temperature, room temperature, ultraviolet index (UV index), weather information or stock market information. Certainly, the LED module 340 can also display a brand mark to enhance the user's impression thereon.

Figure 4:
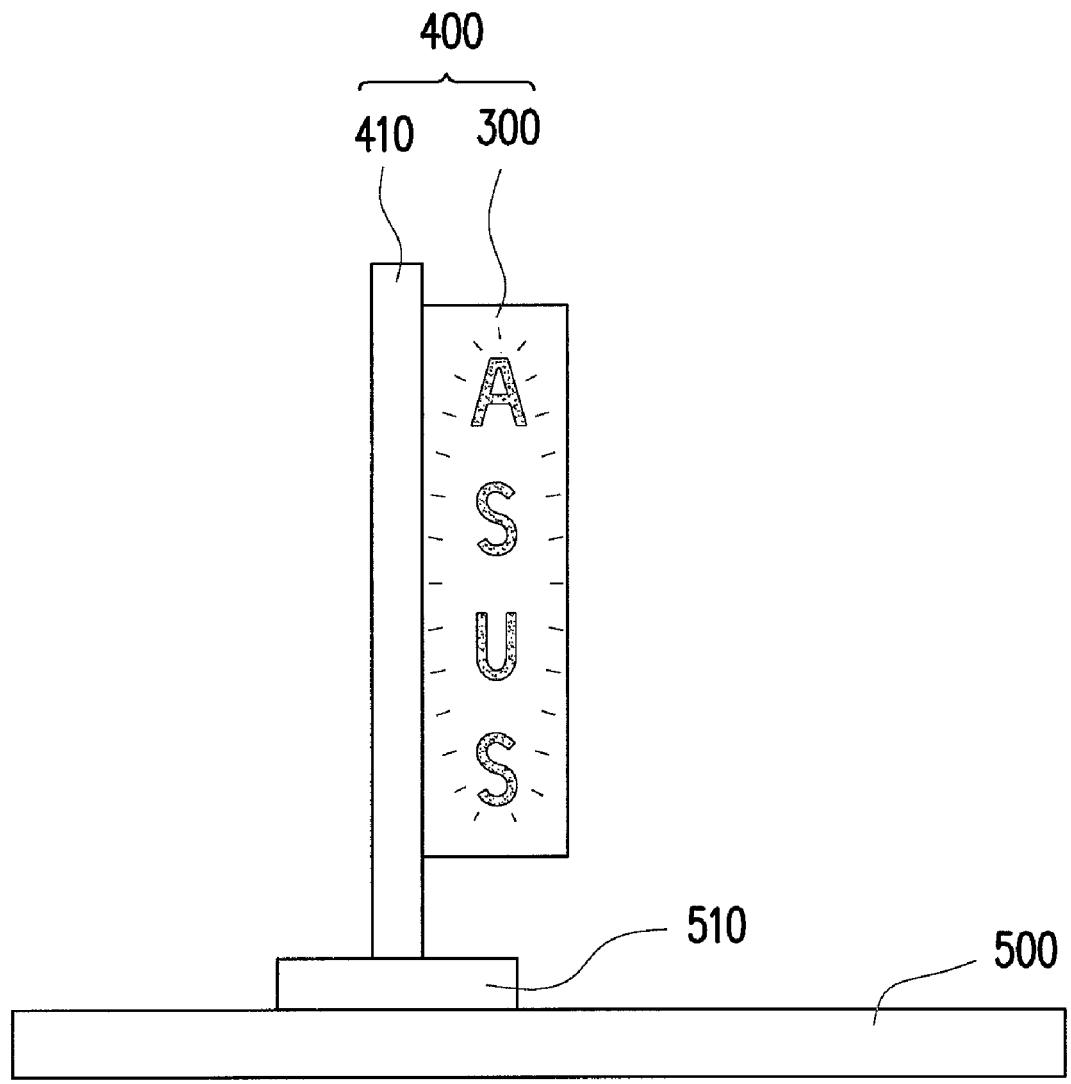
FIG. 4 is a diagram showing a board card with the electrical fan displaying a message.

FIG. 4 is a diagram showing a board card with the electrical fan displaying a message. Referring to FIG. 4, during a user is operating a computer, the heat source of the first substrate 410 makes the temperature thereof increasing. At the time, the revolving spindle 310 with the blades 320 of the electrical fan 300 is rotating. Meanwhile, driven by the control circuit 330, the LEDs 344 of the LED module 340 starts work and displays messages.

Since the light-emitting direction of the LED module 340 is a radial direction of the revolving spindle 310, when the board card 400 is inserted in the slot of the motherboard 500, the user is able to read the messages displayed by the LED module 340 from the side direction of the electrical fan 300 (i.e., the rotation direction of the blades 320). In comparison with the prior art, the electrical fan and the board card employing the electrical fan of the present invention make the user easily read the messages.

Figure 5A:
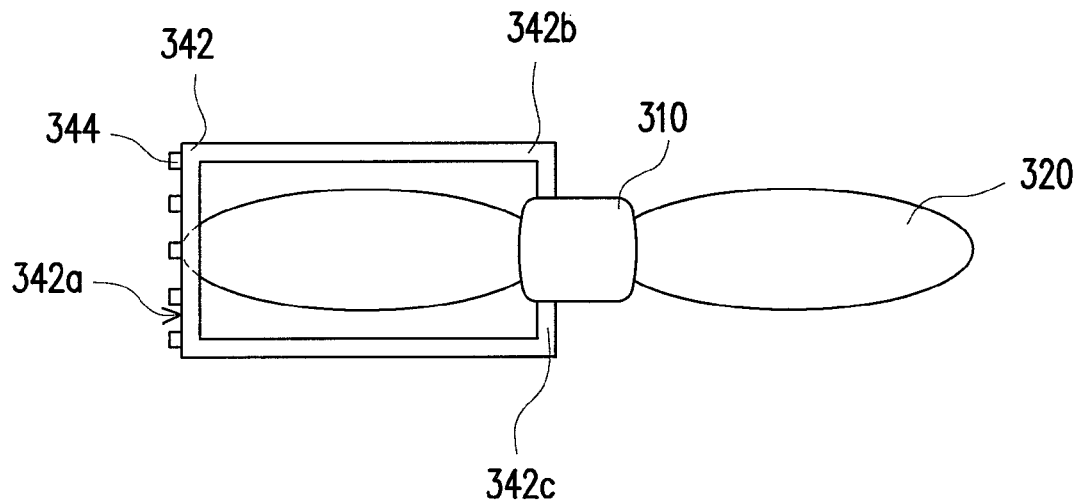
FIGS. 5A and 5B are diagrams showing two layouts of the LED module disposed inside the rotation path of the blades of an electrical fan.
Figure 5B:
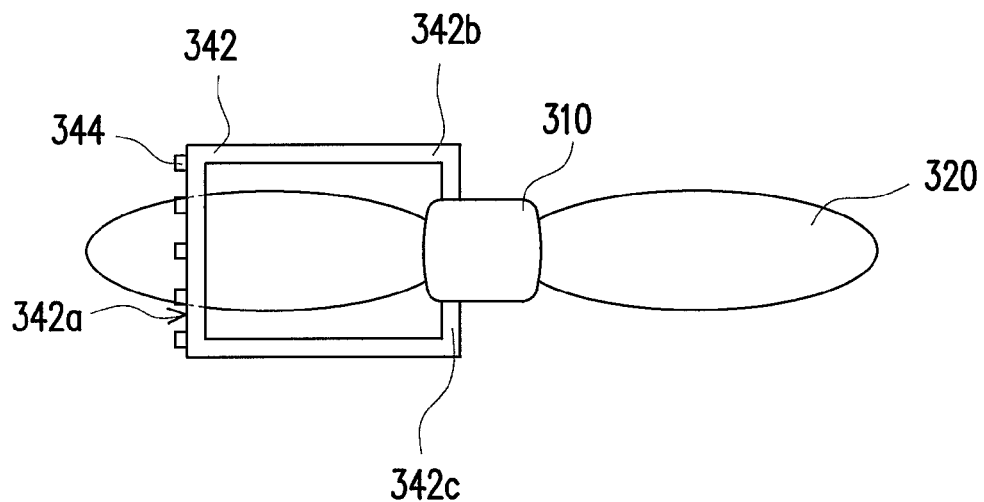

Although, the above-mentioned embodiment exemplarily takes a layout that the LED module 340 is located outside the rotation path of the outermost edges of the blades 320, in other embodiments, the LEDs 344 of the LED module 340 can be located inside the rotation path of the outermost edges of the blades 320 depending on the application requirement, as shown by FIGS. 5A and 5B. When the LEDs 344 of the LED module 340 are located inside the rotation path of the outermost edges of the blades 320, the second substrate 342 is located between two adjacent blades 320 and rotates following the blades 320. At the circumstance, the messages displayed by the LED module 340 are read by a user mainly based on vision resistance of the user.

People skilled in the art should understand, referring to the above-mentioned instructions, the present invention allows to be implemented by using another layout that the LED module 340 is directly formed on the edges of the blades 320 as long as the light-emitting direction of the LED module 340 is a radial direction of the revolving spindle 310 where, as above explained, the user is able to read the messages.

In summary, in comparison with the prior art, the electrical fan and the board card employing the electrical fan of the present invention is advantageous in making a user easily read the messages displayed by the LEDs of the electrical fan.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrical fan of a board card adapted for being electrically connected to a control circuit, the electrical fan comprising:
   a revolving spindle, rotating about an axis;
   a plurality of blades, joined with the revolving spindle; and
   a light emitting diode module, electrically connected to the control circuit, comprising:
      a substrate, connected to the revolving spindle; and
      a plurality of light emitting diodes disposed on a surface of the substrate and the normal vector of the surface is the radial direction of the revolving spindle,
   wherein when the revolving spindle drives the blades rotate, the light-emitting direction of the light emitting diode module is a radial direction of the revolving spindle.

2. The electrical fan according to claim 1, wherein the light emitting diode module has a plurality of light emitting diodes disposed at the edges of the blades.

3. The electrical fan according to claim 1, wherein the control circuit controls the light emitting diodes to progressively display messages.

4. The electrical fan according to claim 1, wherein the light emitting diode module is located in the rotation path of the outermost edges of the blades.

5. The electrical fan according to claim 1, wherein the light emitting diode module is located outside the rotation path of the outermost edges of the blades.

6. A board card, having a control circuit and comprising:
   a first substrate, having a heat source;
   an electrical fan, disposed on the first substrate and comprising:
      a revolving spindle, disposed on the first substrate and rotating about an axis;
      a plurality of blades, joined with the revolving spindle; and
      a light emitting diode module, electrically connected to the control circuit, comprising:
         a second substrate, connected to the revolving spindle; and
         a plurality of light emitting diodes disposed on a surface of the second substrate and the normal vector of the surface is the radial direction of the revolving spindle,
      wherein when the revolving spindle drives the blades rotate, the light-emitting direction of the light emitting diode module is a radial direction of the revolving spindle.

7. The board card according to claim 6, wherein the light emitting diode module has a plurality of light emitting diodes disposed at the edges of the blades.

8. The board card according to claim 6, wherein the light emitting diode module is located in the rotation path of the outermost edges of the blades.

9. The board card according to claim 6, wherein the light emitting diode module is located outside the rotation path of the outermost edges of the blades.

10. The board card according to claim 6, wherein the control circuit comprises a micro controller.

11. The board card according to claim 6, wherein the control circuit controls the light emitting diodes to progressively display messages.

12. The board card according to claim 6, wherein the first substrate is a sound card or a graphics card.

* * * * *